United States Patent
Shim et al.

(10) Patent No.: US 10,546,827 B2
(45) Date of Patent: Jan. 28, 2020

(54) FLIP CHIP

(71) Applicant: WISOL CO., LTD., Osan-si, Gyeonggi-do (KR)

(72) Inventors: Young Seok Shim, Osan-si (KR); Hyung Ju Kim, Osan-si (KR); Joo Hun Park, Osan-si (KR); Chang Dug Kim, Osan-si (KR)

(73) Assignee: WISOL CO., LTD., Osan-si, Gyeonggi-do (KR)

( * ) Notice: Subject to any disclaimer, the term of this patent is extended or adjusted under 35 U.S.C. 154(b) by 144 days.

(21) Appl. No.: 15/617,425

(22) Filed: Jun. 8, 2017

(65) Prior Publication Data
US 2017/0358546 A1   Dec. 14, 2017

(30) Foreign Application Priority Data
Jun. 14, 2016 (KR) .......................... 10-2016-0074068

(51) Int. Cl.
*H01L 23/00* (2006.01)

(52) U.S. Cl.
CPC ............ *H01L 24/13* (2013.01); *H01L 23/562* (2013.01); *H01L 24/02* (2013.01); *H01L 24/05* (2013.01); *H01L 24/10* (2013.01); *H01L 24/11* (2013.01); *H01L 24/16* (2013.01); *H01L 2224/0219* (2013.01); *H01L 2224/0221* (2013.01);
(Continued)

(58) Field of Classification Search
CPC . H01L 2224/13007; H01L 2224/15014; H01L 2224/02166; H01L 2224/10126; H01L 2224/02206; H01L 2224/0221; H01L 2224/02215; H01L 2224/11013; H01L 2224/05026; H01L 24/16; H01L 24/13; H01L 24/10; H01L 24/11; H01L 24/81; H01L 24/05; H01L 24/02; H01L 2224/13021; H01L 2224/05567; H01L 2224/16112; H01L 2224/05571; H01L 2224/0401
See application file for complete search history.

(56) References Cited

U.S. PATENT DOCUMENTS 5,310,699 A     5/1994 Chikawa et al.
6,448,171 B1 *  9/2002 Wang ................ H01L 24/03
                                              257/E21.508
(Continued)

FOREIGN PATENT DOCUMENTS

JP      2008-016514 A   1/2008
KR   10-2009-0015760 A  2/2009

OTHER PUBLICATIONS

Chinese Office Action, dated Jun. 28, 2019, for Chinese Patent Application No. 201710430817.6 which corresponds to the above-identified application.

*Primary Examiner* — Michael M Trinh
(74) *Attorney, Agent, or Firm* — LRK Patent Law Firm

(57) ABSTRACT

A flip chip includes a substrate, an electrode pad layer stacked over the substrate, a passivation layer stacked at both ends of the electrode pad layer, an under bump metallurgy (UBM) layer stacked over the electrode pad layer and the passivation layer, and a bump formed over the UBM layer. The width of an opening on which the passivation layer is not formed over the electrode pad layer is greater than the width of the bump. The flip chip can prevent a crack from being generated in the pad upon ultrasonic bonding.

5 Claims, 5 Drawing Sheets

(52) U.S. Cl.
CPC ............... *H01L 2224/02166* (2013.01); *H01L 2224/02175* (2013.01); *H01L 2224/02185* (2013.01); *H01L 2224/02206* (2013.01); *H01L 2224/02215* (2013.01); *H01L 2224/0401* (2013.01); *H01L 2224/05018* (2013.01); *H01L 2224/05025* (2013.01); *H01L 2224/05026* (2013.01); *H01L 2224/05073* (2013.01); *H01L 2224/05082* (2013.01); *H01L 2224/05083* (2013.01); *H01L 2224/05124* (2013.01); *H01L 2224/05551* (2013.01); *H01L 2224/05557* (2013.01); *H01L 2224/05558* (2013.01); *H01L 2224/05562* (2013.01); *H01L 2224/05564* (2013.01); *H01L 2224/05567* (2013.01); *H01L 2224/05571* (2013.01); *H01L 2224/05573* (2013.01); *H01L 2224/05666* (2013.01); *H01L 2224/05684* (2013.01); *H01L 2224/10126* (2013.01); *H01L 2224/10145* (2013.01); *H01L 2224/11013* (2013.01); *H01L 2224/13007* (2013.01); *H01L 2224/13013* (2013.01); *H01L 2224/13014* (2013.01); *H01L 2224/13021* (2013.01); *H01L 2224/13144* (2013.01); *H01L 2224/16014* (2013.01); *H01L 2224/16055* (2013.01); *H01L 2224/16058* (2013.01); *H01L 2224/16059* (2013.01); *H01L 2224/81205* (2013.01); *H01L 2924/07025* (2013.01); *H01L 2924/10253* (2013.01); *H01L 2924/3512* (2013.01)

(56) References Cited

U.S. PATENT DOCUMENTS

| | | | |
|---|---|---|---|
| 7,053,490 B1* | 5/2006 | Wang | H01L 24/11 257/780 |
| 2003/0067072 A1* | 4/2003 | Ono | H01L 24/10 257/737 |
| 2007/0232056 A1* | 10/2007 | Saitou | H01L 23/293 438/618 |
| 2010/0044860 A1* | 2/2010 | Haba | H01L 23/49811 257/737 |
| 2010/0193945 A1* | 8/2010 | Hochstenbach | H01L 23/3192 257/737 |
| 2011/0212615 A1* | 9/2011 | Huang | H01L 24/11 438/614 |

* cited by examiner

FLIP CHIP

CROSS REFERENCE TO RELATED APPLICATION

The present application claims the benefit of Korean Patent Application No. 10-2016-0074068, filed in the Korean Intellectual Property Office on Jun. 14, 2016, the entire content of which is incorporated herein by reference.

BACKGROUND OF THE INVENTION

1. Technical Field

The present invention relates to a flip chip and, more particularly, to a flip chip capable of preventing the generation of a crack upon ultrasonic bonding.

2. Description of Related Art

In general, after a plurality of semiconductor chips is formed by performing some processes on a semiconductor substrate, various packaging processes. The semiconductor chips are mounted on a printed circuit board to form a semiconductor package.

In order to form the semiconductor package as described above, a wire bonding process of connecting the semiconductor chip to the printed circuit board by attaching a wire, such as a metal lead, to the semiconductor chip and a flip chip package process of connecting a bump and the pad of the printed circuit board by forming the bump in an electrode included in the semiconductor chip are used.

In this case, the flip chip package has a structure in which the semiconductor chips and the printed circuit board are disposed to face each other so that the conductive bumps of the semiconductor chip are electrically connected to the pads of the printed circuit board, respectively. An underfill layer is formed between the semiconductor chips and the printed circuit board to protect the conductive bumps against an external impact.

In particular, as the operating speed of a semiconductor chip is recently improved, it becomes difficult to satisfy the characteristics of a package using an existing wire bonding method. Accordingly, in the package of high-function semiconductor chips, a flip chip package process of directly connecting the semiconductor chips and the printed circuit board is increasingly used.

FIG. 1 is a cross-sectional view of a flip chip package according to a conventional technology.

Referring to FIG. 1, an electrode pad 2 has been formed on the bottom of a semiconductor chip 1. A bump 3 made of a gold (Au) material for electrical connection with a printed circuit board 4 has been formed on the electrode pad 2.

A bonding pad 5 in which the bump 3 is seated has been formed on the printed circuit board 4 on which the semiconductor chip 1 is mounted. A contact layer 6 coated with a gold (Au) material so as to increase electrical conductivity and to prevent the oxidization of the bonding pad is formed on the bonding pad 5. Furthermore, underfill resin 7, such as epoxy resin that is a thermosetting adhesive, is formed between the semiconductor chip 1 and the printed circuit board 4 to reinforce the space between the bumps. Accordingly, the underfill resin functions to prevent the generation of a defect attributable to stress concentrated on a boundary portion of the semiconductor chip and the bump due to thermal expansion or thermal contraction attributable to a temperature change.

For electrical connection between the semiconductor chip 1 and the printed circuit board 4, the semiconductor chip 1 is seated in the printed circuit board 4 so that the bump 3 of the semiconductor chip 1 comes into contact with the contact layer 6. Thereafter, the bump 3 and the bonding pad 5 are bonded together by applying heat and pressure.

In the case of an ultrasonic bonding method, ultrasonic energy is applied to the semiconductor chip, and the semiconductor chip is heated while weight is applied thereto, so the bump is melted by heat, pressure and ultrasonic energy and then bonded to the pad. Accordingly, the semiconductor chip and the printed circuit board are electrically connected.

However, such a conventional structure has a problem in that a crack is generated in the electrode pad of the semiconductor flip chip due to pressure applied upon bonding.

PRIOR ART DOCUMENT

Patent Document (Patent Document 1) Korean Patent Application Publication No. 10-2009-0015760

SUMMARY OF THE INVENTION

An object of the present invention is to provide a flip chip in which a crack is not generated upon ultrasonic bonding.

A flip chip according to an embodiment of the present invention includes a substrate, an electrode pad layer stacked over the substrate, a passivation layer stacked at both ends of the electrode pad layer, an under bump metallurgy (UBM) layer stacked over the electrode pad layer and the passivation layer, and a bump formed over the UBM layer. The width of an opening on which the passivation layer is not formed over the electrode pad layer is greater than the width of the bump.

The flip chip according to an embodiment of the present invention may further include a multi-layer pattern layer stacked between the substrate and the electrode pad layer.

Furthermore, in the flip chip according to an embodiment of the present invention, a via for connection with another metal layer may be formed in the multi-layer pattern layer.

Furthermore, in the flip chip according to an embodiment of the present invention, the thickness of the aluminum pad layer and the passivation layer may be 0.35 μm or more.

Furthermore, in the flip chip according to an embodiment of the present invention, the bump may include gold (Au).

Furthermore, in the flip chip according to an embodiment of the present invention, the opening may have any one of a quadrangle, a circle and an octagon, and the bump may have any one of a circle and a quadrangle.

Furthermore, in the flip chip according to an embodiment of the present invention, a buffer layer for distributing a force applied to the bump upon bonding may be further included at both ends of the UBM layer.

Furthermore, in the flip chip according to an embodiment of the present invention, the buffer layer may include polyimide.

Furthermore, in the flip chip according to an embodiment of the present invention, the substrate may be a silicon wafer using a CMOS process.

DETAILED DESCRIPTION

Figure 1:
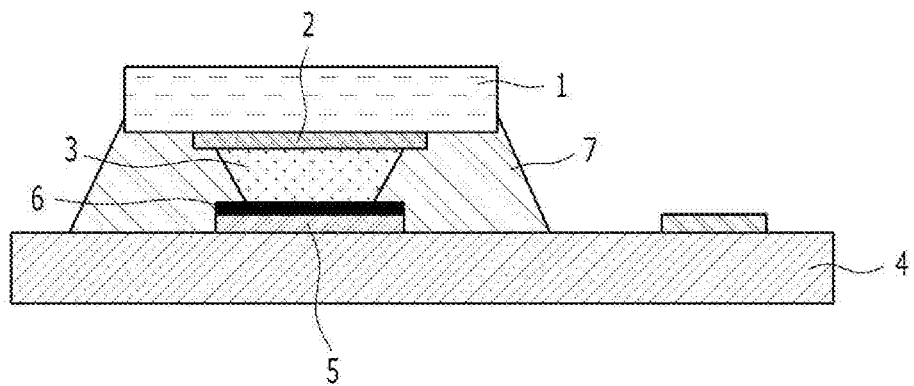
FIG. 1 is a cross-sectional view of a flip chip package according to a conventional technology.

The present invention may be modified in various ways and may be implemented to have several embodiments. Specific embodiments are illustrated in the drawings and are described in detail. It is however to be understood that the present invention is not intended to be limited to the specific embodiments and the present invention includes all modifications, equivalents, and substitutions which fall within the spirit and technological scope of the present invention.

In the drawings, embodiments of the present invention are not limited to specific forms illustrated in the drawings and have been enlarged for clarity. Specific terms have been used in the specification, but the terms are used to only describe the present invention, but are not used to limit the meaning of the terms or the range of right of the present invention written in the claim.

In the specification, an expression "and/or" is used as a meaning including at least one of elements listed front and back. Furthermore, an expression "connected/coupled" is used as a meaning including that one element is directly connected to the other element and that the two elements are connected by a third element. In the specification, the singular form may include the plural form unless specially described otherwise. Furthermore, terms, such as "includes or comprises" and/or "including or comprising" used in the specification, do not exclude the existence or addition of one or more elements, steps, operations and/or devices in the described elements, steps, operations and/or devices.

Furthermore, expressions, such as "the first" and "the second", are used to only distinguish a plurality of elements from one another and do not limit the sequence or other characteristics of the elements.

In the description of the embodiments, when it is said that each layer (or film), an area, a pattern or a structure is formed "over/on" or "under/below" a substrate, each layer (or film), an area, a pad or pattern, this includes both expressions, including that one element is directly formed on the other element and that a third element is interposed between the two elements. A criterion for the term "over/on" or "under/below" of each layer is described based on the drawings.

The structure of a flip chip for ultrasonic bonding and a method for manufacturing the flip chop according to embodiments of the present invention are described in detail below with reference to the accompanying drawings.

Figure 2:
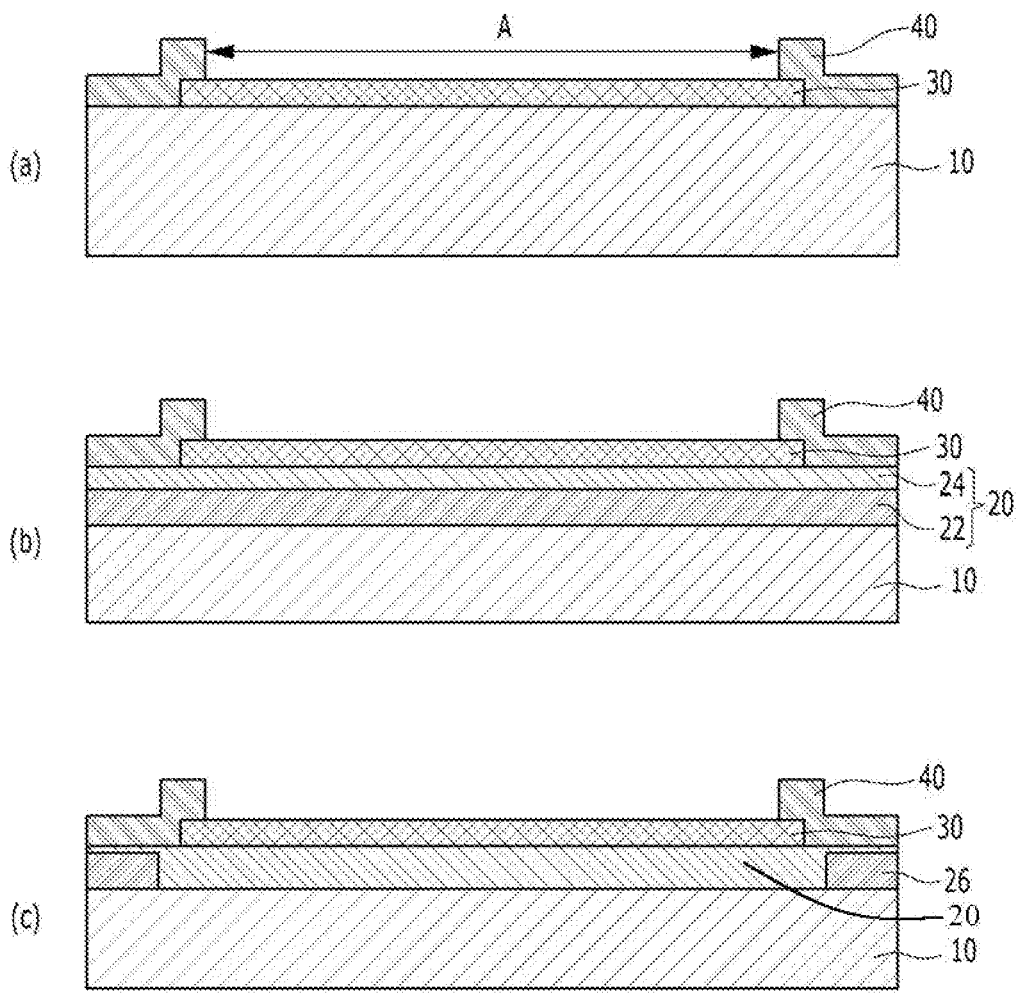
FIG. 2 is a cross-sectional view of a flip chip before a bump of the flip chip is formed in accordance with an embodiment of the present invention.
Figure 3:
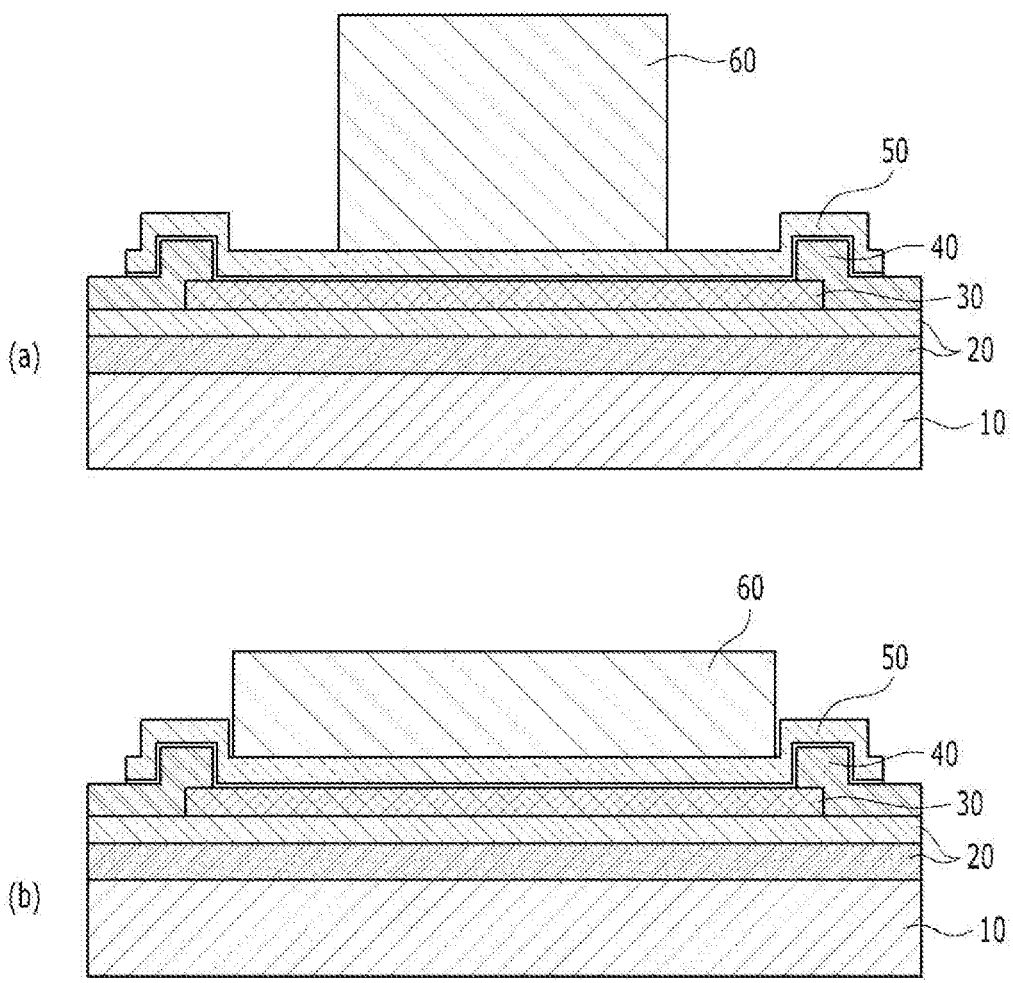
FIG. 3 is a general cross-sectional view of the flip chip according to an embodiment of the present invention.

FIG. 2 is a cross-sectional view of a flip chip according to an embodiment of the present invention and shows the flip chip before a bump is attached to the flip chip. FIG. 3 shows the flip chip to which the bump has been attached.

Referring to (a) of FIG. 2, the flip chip includes a semiconductor substrate 10, an electrode pad layer 30 formed on the semiconductor substrate, and a passivation layer 40 formed on the electrode pad layer 30.

The semiconductor substrate 10 may be a silicon (Si) wafer formed by a complementary metal-oxide-semiconductor (CMOS) process. The CMOS process has been well known in the art and a detailed description thereof is omitted.

The electrode pad layer 30 may be an aluminum layer. The electrode pad layer 30 may have a thin thickness, and the shape of the passivation layer 40 should not be changed by the deformation of the electrode pad layer 30. The electrode pad layer 30 may have a thickness of 0.35 μm or more. The passivation layer 40 is stacked at both ends of a bump because the bump may be formed on the electrode pad layer 30.

The passivation layer 40 is simultaneously stacked on the ends of the substrate 10 and the electrode pad layer 30 in order to protect the substrate 10 and the electrode pad layer 30 so that they are contaminated by an external substance. That is, the passivation layer 40 protects elements against an external contaminant, such as moisture. The passivation layer 40 is advantageously thin and may have a thickness of 0.35 μm or more.

An oxide film, such as $SiO_2(SiN)$, may be used as the passivation layer 40.

A portion that belongs to the electrode pad layer 30 and on which the passivation layer 40 has not been stacked is defined as an opening. The shape of the opening is not limited and may have various shapes, such as a quadrangle, circle or octagon. The opening is a portion in which a bump is formed. Accordingly, the opening may be designed by taking into consideration total volume because the adhesion portion of the opening is widened due to compression upon packaging with an insulating substrate. For example, if a gold (Au) bump having a circle, a diameter of 44 mm and height of 27 μm is to be bonded, the height of the bump compressed after bonding may be taken into consideration. For example, if the height of the bump is expected to be reduced to 10 μm after bonding, the width of the opening may be determined by taking into consideration the reduced height. The diameter of the bump after the compression is 72 mm because the volume of the previous bump may be the same as that of the bump compressed to 10 μm. Accordingly, the diameter of the opening may be wider than 72 mm, and the opening may be designed by taking into consideration the twisted location of the bump. The width of the opening may be wider than the width of the bump prior to the bonding.

This may be expressed into the following equation.

Bump volume prior to flip bonding=bump volume after flip bonding $$(44/2)^2 \times \pi \times 27 = r^2 \pi \times 10$$

$$2r=72.4 \text{ mm} \qquad \text{[Equation 1]}$$

A multi-layer pattern layer is not advantageously disposed under the electrode pad layer 30. The reason for this is that if the multi-layer pattern layer is disposed under the electrode pad layer 30, a crack may be generated in a pattern layer upon compression. If the multi-layer pattern layer is necessary, however, it may have a thickness to the extent that it can reduce an impact upon compression. The thickness of the multi-layer pattern layer may be 1~5 μm. Furthermore, a via that connects layers may be formed in the multi-layer pattern layer so as to reduce an impact applied upon flip bonding.

In FIG. 2, (b) shows an example in which a multi-layer pattern layer 20 including a first metal pattern layer 22 and a second metal pattern layer 24 has been stacked between the substrate 10 and the electrode pad layer 30. In FIG. 2, (c)

shows an example in which the multi-layer pattern layer 20 having a via 26 formed therein has been stacked between the substrate 10 and the electrode pad layer 30.

If the multi-layer pattern layer 20 having a form, such as that of (b) or (c) of FIG. 2, is formed between the substrate 10 and the electrode pad layer 30, damage to a metal layer upon flip bonding can be prevented.

FIG. 3 shows an example in which a bump has been formed in the FIG. 2. In FIG. 3, (a) is a cross-sectional view of the flip chip prior to flip bonding. In FIG. 3, (b) is a cross-sectional view showing the state in which the bump has been compressed after flip bonding.

Referring to FIG. 3, the flip chip according to an embodiment of the present invention includes the substrate 10, the multi-layer pattern layer 20 formed on the substrate, the electrode pad layer 30 formed on the multi-layer pattern layer, the passivation layer 40 formed at both ends of the electrode pad layer 30 to form an opening and to protect elements, an under bump metallurgy (UBM) layer 50 formed on the electrode pad layer 30, and a bump 60 formed on the UBM layer 50.

The substrate 10, the multi-layer pattern layer 20, the electrode pad layer 30 and the passivation layer 40 have the same configurations as those described with reference to FIG. 2.

The UBM layer 50 is a tungsten-titanium (W—Ti) layer and formed under the bump before the bump is formed. The bump requires an adhesion promotion layer for bonding the bump to the aluminum pad layer because it has poor wettability with respect to aluminum. Furthermore, the bump requires a diffusion barrier for preventing the bump from being diffused in the flip chip because it is rapidly diffused due to a low melting point. That is, the UBM layer 50 functions to improve the adhesion and prevent diffusion of the bump.

The bump 60 is formed on the UBM layer 50. The bump is not limited to any shape, but there should be no interference between the bump and the electrode pad layer 30 after flip bonding. That is, the bump 60 may have various shapes, such as a circle or a quadrangle, but may be designed by taking into consideration the opening size of the pad in order to obviate such interference. Furthermore, the size of the bump may be determined by taking into consideration the adhesive strength of the bump after bumping. The bump 60 may include a gold (Au) component. The bump 60 may have a hardness of 90 HV or less. The reason for this is that the height of the bump needs to be taken into consideration after flip bonding.

The bump is compressed after flip bonding as shown in (b) of FIG. 3. If the hardness is too strong, the contact layer of the bump and the substrate may be deteriorated because adhesive strength is reduced due to the compression.

Figure 4:
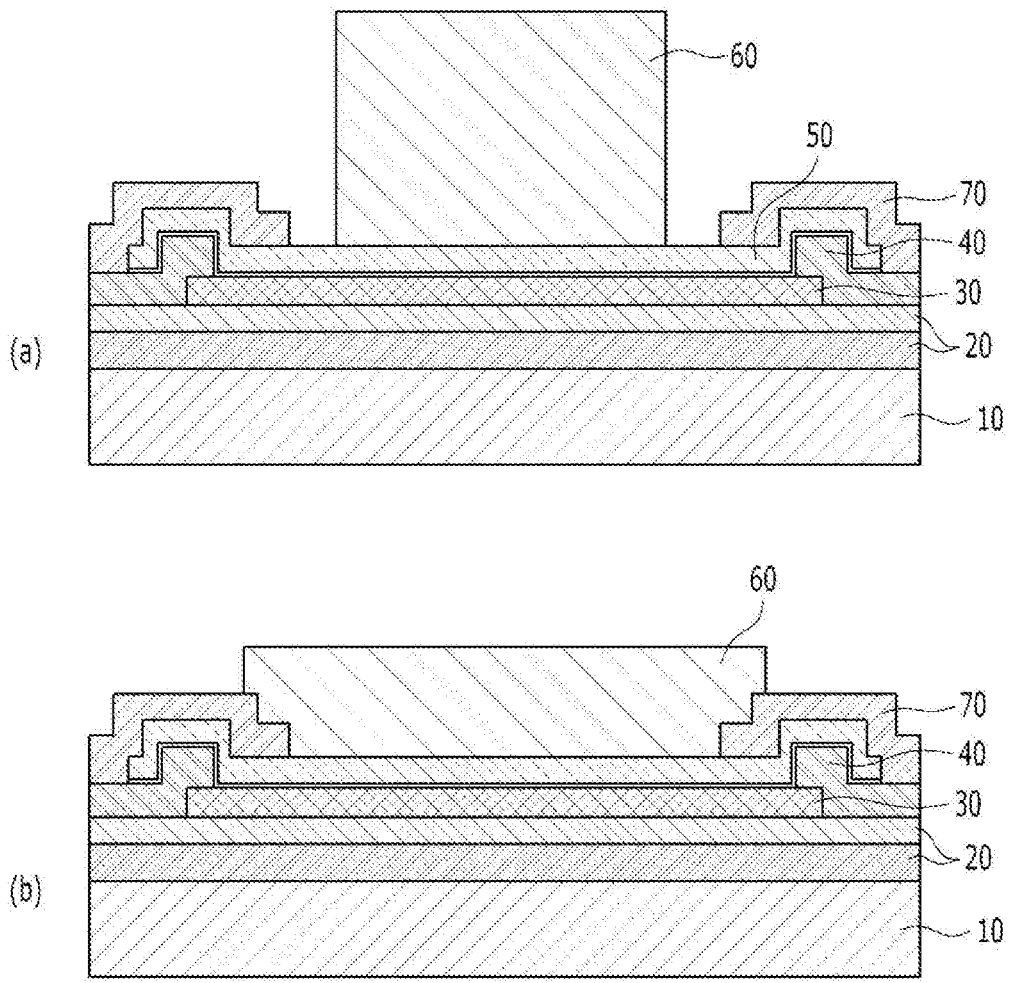
FIG. 4 is a cross-sectional view of a flip chip according to another embodiment of the present invention.

FIG. 4 shows another embodiment of the present invention and shows an example in which a buffer layer 70 has been added.

In order to reduce an impact on the UBM layer 50 attributable to flip bonding, the buffer layer 70 may be formed at both ends of the UBM layer 50. A polyimide layer may be used as the buffer layer 70.

In FIG. 4, (a) shows the state prior to flip bonding and (b) shows the state after flip bonding.

Referring to (b) of FIG. 4, pressure applied to the bump 60 upon flip bonding may be distributed to the buffer layer 70, thereby being capable of protecting the UBM layer 50.

Figure 5:
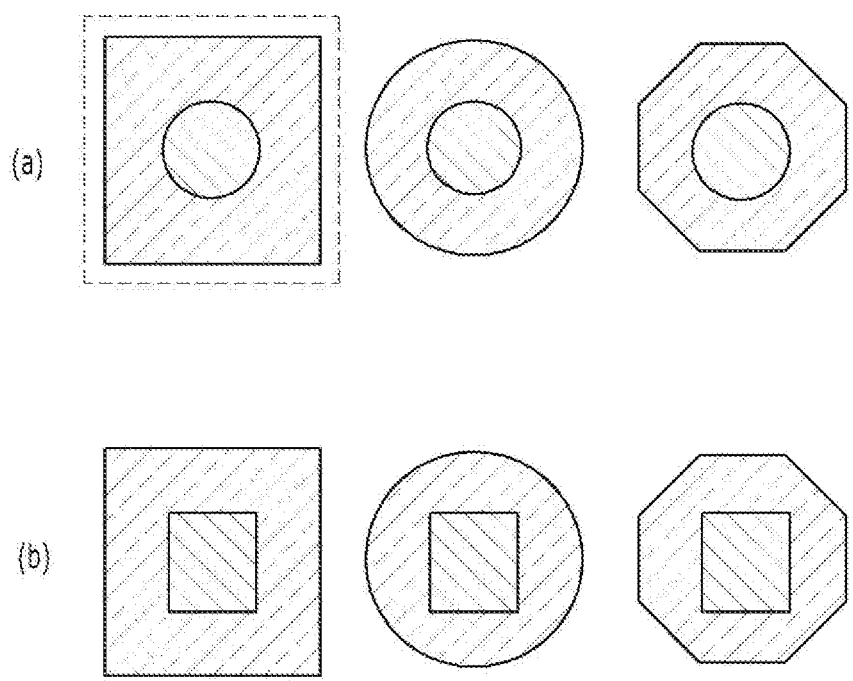
FIG. 5 shows shapes of an opening and bump according to embodiments of the present invention.

FIG. 5 is a plan view showing examples of the shapes of the bump and corresponding openings according to embodiments of the present invention.

In FIG. 5, (a) sequentially shows examples in which the bump has a circle and the opening has a quadrangle, a circle and an octagon from the left. In FIG. 5, (b) sequentially shows examples in which the bump has a quadrangle and the opening has a quadrangle, a circle and an octagon from the left.

As described above, the shapes of the bump and the opening are not limited, but the opening having a quadrangle and the bump having a circle may be used in order to prevent interference between the bump and the opening.

In accordance with the flip chip according to an embodiment of the present invention, a crack can be prevented from occurring in the pad upon ultrasonic bonding.

In particular, the flip chip according to an embodiment of the present invention can be applied to various packages because a gold (Au) bump flip bonding process can be used upon wafer bonding in a complementary metal-oxide-semiconductor (CMOS) process using a wire bonding package assembly process.

Although the present invention has been described as described above, a person having ordinary skill in the art to which the present invention pertains will recognize that the present invention may be implemented in other forms without departing from the technological spirit and essential characteristic of the present invention.

Accordingly, the aforementioned embodiments are merely illustrative and are not intended to restrict the scope of the present invention to the aforementioned embodiments only. It is also to be noted that the illustrated flowchart is merely sequential order illustrated to achieve the most preferred results in implementing the present invention, and other additional steps may be provided or some of the steps may be deleted.

The scope of the present invention will be defined by the claims, but a configuration directly derived from the writing of the claims and all of changes or modified forms derived from an equivalent configuration thereof should be construed as belonging to the range of right of the present invention.

What is claimed is:

1. A flip chip comprising:
   a substrate;
   an electrode pad layer stacked over the substrate;
   a passivation layer stacked at both ends of the electrode pad layer;
   a multi-layer pattern layer stacked between the substrate and the electrode pad layer, where a via for connection with another metal layer is formed at both in the multi-layer pattern layer, where the via is arranged at both ends of the multi-layer pattern layer under the passivation layer;
   an under bump metallurgy (UBM) layer stacked over the electrode pad layer and the passivation layer;
   a bump formed over the UBM layer; and
   a buffer layer comprising polyimide for distributing a force applied to the bump upon bonding at both ends of the UBM layer,
   wherein a width of an opening on which the passivation layer is not formed over the electrode pad layer is greater than a width of the bump, and
   wherein the buffer layer is step-shaped at both ends of the UBM layer.

2. The flip chip of claim 1, wherein a thickness of the electrode pad layer and the passivation layer is 0.35 µm or more.

3. The flip chip of claim 1, wherein the bump comprises gold (Au).

4. The flip chip of claim 1, wherein:
an area of the opening has any one of a quadrangle, a circle and an octagon, and
the bump has any one of a circle and a quadrangle.

5. The flip chip of claim 1, wherein the substrate comprises a silicon wafer using a CMOS process.

* * * * *